(12) United States Patent
Akram et al.

(10) Patent No.: US 7,300,857 B2
(45) Date of Patent: Nov. 27, 2007

(54) THROUGH-WAFER INTERCONNECTS FOR PHOTOIMAGER AND MEMORY WAFERS

(75) Inventors: Salman Akram, Boise, ID (US); Charles Watkins, Eagle, ID (US); Mark Hiatt, Eagle, ID (US); David Hembree, Boise, ID (US); James Wark, Boise, ID (US); Warren Farnworth, Nampa, ID (US); Mark Tuttle, Boise, ID (US); Sidney Rigg, Meridian, ID (US); Steven Oliver, Boise, ID (US); Kyle Kirby, Boise, ID (US); Alan Wood, Boise, ID (US); Lu Velicky, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 229 days.

(21) Appl. No.: 10/932,296

(22) Filed: Sep. 2, 2004

(65) Prior Publication Data

US 2006/0043599 A1    Mar. 2, 2006

(51) Int. Cl.
H01L 21/441    (2006.01)
(52) U.S. Cl. ............. 438/459; 438/612; 438/667; 257/621; 257/E21.597
(58) Field of Classification Search ............. 438/667
See application file for complete search history.

(56) References Cited

U.S. PATENT DOCUMENTS

| | | |
|---|---|---|
| 3,345,134 A | 10/1967 | Heymer et al. |
| 4,534,100 A | 8/1985 | Lane |
| 4,906,314 A | 3/1990 | Farnworth et al. |
| 5,130,783 A | 7/1992 | McLellan |
| 5,371,397 A | 12/1994 | Maegawa et al. |
| 5,424,573 A | 6/1995 | Kato et al. |
| 5,435,887 A | 7/1995 | Rothschild et al. |
| 5,447,871 A * | 9/1995 | Goldstein .............. 438/618 |
| 5,505,804 A | 4/1996 | Mizuguchi et al. |
| 5,560,047 A | 10/1996 | Shimada |
| 5,593,913 A | 1/1997 | Aoki |
| 5,605,783 A | 2/1997 | Revelli et al. |
| 5,627,106 A * | 5/1997 | Hsu .............. 438/459 |
| 5,672,519 A | 9/1997 | Song et al. |
| 5,694,246 A | 12/1997 | Aoyama et al. |
| 5,708,293 A | 1/1998 | Ochi et al. |

(Continued)

FOREIGN PATENT DOCUMENTS

EP    0 886 323    12/1998

(Continued)

OTHER PUBLICATIONS

U.S. Appl. No. 10/785,466, Kirby.

(Continued)

*Primary Examiner*—Stephen W. Smoot
(74) *Attorney, Agent, or Firm*—Perkins Coie LLP (57) ABSTRACT

A through-wafer interconnect for imager, memory and other integrated circuit applications is disclosed, thereby eliminating the need for wire bonding, making devices incorporating such interconnects stackable and enabling wafer level packaging for imager devices. Further, a smaller and more reliable die package is achieved and circuit parasitics (e.g., L and R) are reduced due to the reduced signal path lengths.

32 Claims, 6 Drawing Sheets

U.S. PATENT DOCUMENTS

| | | |
|---|---|---|
| 5,771,158 A | 6/1998 | Yamagishi et al. |
| 5,776,824 A | 7/1998 | Farnworth et al. |
| 5,811,799 A | 9/1998 | Wu |
| 5,821,532 A | 10/1998 | Beaman et al. |
| 5,857,963 A | 1/1999 | Pelchy et al. |
| 5,861,654 A | 1/1999 | Johnson |
| 5,877,040 A | 3/1999 | Park et al. |
| 5,897,338 A | 4/1999 | Kaldenberg |
| 5,914,488 A | 6/1999 | Sone |
| 5,977,535 A | 11/1999 | Rostoker |
| 5,998,862 A | 12/1999 | Yamanaka |
| 6,080,291 A | 6/2000 | Woodruff et al. |
| 6,104,086 A | 8/2000 | Ichikawa et al. |
| 6,114,240 A | 9/2000 | Akram et al. |
| 6,143,588 A | 11/2000 | Glenn |
| 6,236,046 B1 | 5/2001 | Watabe et al. |
| 6,259,083 B1 | 7/2001 | Kimura |
| 6,266,197 B1 | 7/2001 | Glenn et al. |
| 6,274,927 B1 | 8/2001 | Glenn |
| 6,285,064 B1 | 9/2001 | Foster |
| 6,351,027 B1 | 2/2002 | Giboney et al. |
| 6,372,548 B2 | 4/2002 | Bessho et al. |
| 6,407,381 B1 | 6/2002 | Glenn et al. |
| 6,411,439 B2 | 6/2002 | Nishikawa |
| 6,483,652 B2 | 11/2002 | Nakamura |
| 6,503,780 B1 | 1/2003 | Glenn et al. |
| 6,541,762 B2 | 4/2003 | Kang et al. |
| 6,566,745 B1 | 5/2003 | Beyne et al. |
| 6,603,183 B1 | 8/2003 | Hoffman |
| 6,617,623 B2 | 9/2003 | Rhodes |
| 6,661,047 B2 | 12/2003 | Rhodes |
| 6,667,551 B2 | 12/2003 | Hanaoka et al. |
| 6,670,986 B1 | 12/2003 | Ben Shoshan et al. |
| 6,686,588 B1 | 2/2004 | Webster et al. |
| 6,703,310 B2 | 3/2004 | Mashino et al. |
| 6,734,419 B1 | 5/2004 | Glenn et al. |
| 6,759,266 B1 | 7/2004 | Hoffman |
| 6,774,486 B2 | 8/2004 | Kinsman |
| 6,778,046 B2 | 8/2004 | Stafford et al. |
| 6,791,076 B2 | 9/2004 | Webster |
| 6,795,120 B2 | 9/2004 | Takagi et al. |
| 6,797,616 B2 | 9/2004 | Kinsman |
| 6,800,943 B2 | 10/2004 | Adachi |
| 6,813,154 B2 | 11/2004 | Diaz et al. |
| 6,825,458 B1 | 11/2004 | Moess et al. |
| 6,828,663 B2 | 12/2004 | Chen et al. |
| 6,828,674 B2 | 12/2004 | Karpman |
| 6,844,978 B2 | 1/2005 | Harden et al. |
| 6,864,172 B2 | 3/2005 | Noma et al. |
| 6,882,021 B2 | 4/2005 | Boon et al. |
| 6,885,107 B2 | 4/2005 | Kinsman |
| 6,934,065 B2 | 8/2005 | Kinsman |
| 6,946,325 B2 | 9/2005 | Yean et al. |
| 7,029,937 B2 * | 4/2006 | Miyazawa ................ 438/40 |
| 2002/0006687 A1 | 1/2002 | Lam |
| 2002/0057468 A1 | 5/2002 | Segawa et al. |
| 2002/0089025 A1 | 7/2002 | Chou |
| 2002/0096729 A1 | 7/2002 | Tu et al. |
| 2002/0113296 A1 | 8/2002 | Cho et al. |
| 2002/0145676 A1 | 10/2002 | Kuno et al. |
| 2002/0190371 A1* | 12/2002 | Mashino et al. ............ 257/690 |
| 2003/0062601 A1 | 4/2003 | Harnden et al. |
| 2003/0151144 A1* | 8/2003 | Muta et al. ................ 257/774 |
| 2004/0012698 A1 | 1/2004 | Suda et al. |
| 2004/0023469 A1 | 2/2004 | Suda |
| 2004/0038442 A1 | 2/2004 | Kinsman |
| 2004/0041261 A1 | 3/2004 | Kinsman |
| 2004/0082094 A1 | 4/2004 | Yamamoto |
| 2004/0137661 A1* | 7/2004 | Murayama ................ 438/106 |
| 2004/0214373 A1 | 10/2004 | Jiang et al. |
| 2004/0245649 A1 | 12/2004 | Imaoka |
| 2005/0026443 A1* | 2/2005 | Goo et al. ................ 438/694 |
| 2005/0052751 A1 | 3/2005 | Liu et al. |
| 2005/0104228 A1 | 5/2005 | Rigg et al. |
| 2005/0110889 A1 | 5/2005 | Tuttle et al. |
| 2005/0127478 A1 | 6/2005 | Hiatt et al. |
| 2005/0151228 A1 | 7/2005 | Tanida et al. |
| 2005/0236708 A1 | 10/2005 | Farnworth et al. |
| 2005/0254133 A1 | 11/2005 | Akram et al. |
| 2005/0285154 A1* | 12/2005 | Akram et al. ............... 257/234 |

FOREIGN PATENT DOCUMENTS

| | | |
|---|---|---|
| EP | 1 157 967 A2 | 11/2001 |
| FR | 2 835 654 A1 | 8/2003 |
| JP | 59-101882 A | 6/1984 |
| JP | 59-191388 | 10/1984 |
| JP | 07-263607 A | 10/1995 |
| JP | 2001-077496 A | 3/2001 |
| WO | WO-90/05424 A1 | 5/1990 |
| WO | WO-02/075815 A1 | 9/2002 |
| WO | WO-02/095796 A2 | 11/2002 |
| WO | WO-2004/054001 A2 | 6/2004 |

OTHER PUBLICATIONS

U.S. Appl. No. 10/845,304, Jiang et al.
U.S. Appl. No. 10/857,948, Boettiger et al.
U.S. Appl. No. 10/863,994, Akram et al.
U.S. Appl. No. 10/864,974, Kirby et al.
U.S. Appl. No. 10/867,352, Farnworth et al.
U.S. Appl. No. 10/867,505, Farnworth et al.
U.S. Appl. No. 10/879,398, Akram et al.
U.S. Appl. No. 10/879,838, Kirby et al.
U.S. Appl. No. 10/893,022, Hall et al.
U.S. Appl. No. 10/894,262, Farnworth et al.
U.S. Appl. No. 10/901,851, Derderian et al.
U.S. Appl. No. 10/910,491, Bolken et al.
U.S. Appl. No. 10/915,180, Street et al.
U.S. Appl. No. 10/919,604, Farnworth et al.
U.S. Appl. No. 10/922,177, Oliver et al.
U.S. Appl. No. 10/922,192, Farnworth.
U.S. Appl. No. 10/925,406, Oliver.
U.S. Appl. No. 10/925,501, Oliver.
U.S. Appl. No. 10/925,502, Watkins et al.
U.S. Appl. No. 10/927,550, Derderian et al.
U.S. Appl. No. 10/927,760, Chong et al.
U.S. Appl. No. 10/928,598, Kirby.
U.S. Appl. No. 11/027,443, Kirby.
U.S. Appl. No. 11/054,692, Boemler.
U.S. Appl. No. 11/056,211, Hembree et al.
U.S. Appl. No. 11/056,484, Boettiger et al.
U.S. Appl. No. 11/061,034, Boettiger.
U.S. Appl. No. 11/146,783, Tuttle et al.
U.S. Appl. No. 11/169,546, Sulfridge.
U.S. Appl. No. 11/169,838, Sulfridge.
U.S. Appl. No. 11/177,905, Akram.
U.S. Appl. No. 11/209,524, Akram.
U.S. Appl. No. 11/217,169, Hiatt et al.
U.S. Appl. No. 11/217,877, Oliver et al.
U.S. Appl. No. 11/218,126, Farnworth et al.
U.S. Appl. No. 11/218,243, Kirby et al.
Aachboun, A. and P. Ranson, "Cryogenic etching of deep narrow trenches in silicon," J. Vac. Sci. Technol. A 18(4), Jul./Aug. 2000, pp. 1848-1852.
Aachboun, S. and P. Ranson, "Deep anisotropic etching of silicon," J. Vac. Sci. Technol. A 17(4), Jul./Aug. 1999, pp. 2270-2273.
Austin, M.D. and S.Y. Chou, "Fabrication of 70 nm channel length polymer organic thin-film transistors using nanoimprint lithography," Applied Physics Letters, vol. 81, No. 23, pp. 4431-4433, Dec. 2, 2002, American Institute of Physics.
Blackburn, J.M. et al., "Deposition of Conformal Copper and Nickel Films from Supercritical Carbon Dioxide," Science, vol. 294, pp. 141-145, Oct. 5, 2001.

Brubaker, C. et al., "Ultra-thick Lithography for Advanced Packaging and MEMS," SPIE's 27th Annual International Symposium on Microlithography 2002, Mar. 3-8, 2002, Santa Clara, CA.

Cheng, Yu-T. et al., "Vacuum Packaging Technology Using Localized Aluminum/Silicon-to-Glass Bonding," Journal of Microelectromechanical Systems, vol. 11, No. 5, pp. 556-565, Oct. 2002.

DuPont Electronic Materials, Data Sheet, Pyralux PC 2000 Flexible Composites, 4 pages, Oct. 1998, <http://www.dupont.com/fcm>.

Edmund Industrial Optics, Mounted IR Filters, 1 page, retrieved from the Internet on Jun. 30, 2003, <http://www.edmundoptics.com>.

Hamdorf, M. et al., "Surface-rheological measurements on glass forming polymers based on the surface tension driven decay of imprinted corrugation gratings," Journal of Chemical Physics, vol. 112, No. 9, pp. 4262-4270, Mar. 1, 2000, American Institute of Physics.

Hirafune, S. et al., "Packaging Technology for Imager Using Through-hole Interconnection in Si Substrate," Proceeding of HDP'04, IEEE, pp. 303-306, Jul. 2004.

IBM, Zurich Research Laboratory, EPON SU-8 photoresist, 1 page, retrieved from the Internet on Jan. 21, 2003, <http://www.zurich.ibm.com/st/mems/su8.html>.

Intrinsic Viscosity and Its Relation to Intrinsic Conductivity, 9 pages, retrieved from the Internet on Oct. 30, 2003, <http://www.ciks.cbt.nist.gov/-garbocz/paper58/node3.html>.

King, B. et al., Optomec, Inc., M3D™ Technology, Maskless Mesoscale™ Materials Deposition, 5 pages, <http://www.optomec.com/downloads/M3D%20White%Paper%20080502.pdf>, retrieved from the Internet on Jun. 17, 2005.

Kingpak Technology, Inc. "CMOS Image Sensor Packaging," 1 page, retrieved from the Internet on Aug. 26, 2003, <http://www.kingpak.com/CMOSImager.html>.

Kramer, S.J. et al., "Annual Report—Applications of Supercritical Fluid Technology to Semiconductor Device Processing," pp. 1-29, Nov. 2001.

Kyocera Corporation, Memory Package, 1 page, retrieved from the Internet on Dec. 3, 2004, <http://global.kyocera.com/prdct/semicon/ic_pkg/memory_p.html>.

Lin, Tim (Zhigang) and Rick Yoon, "One Package Technique of Exposed MEMS Sensors," pp. 105-108, 2002 International Symposium on Microelectronics, Sep. 2002.

Ma, X. et al., "Low Temperature Bonding for Wafer Scale Packaging and Assembly of Micromachined Sensors," Final Report 1998-1999 for MICRO Project 98-144, 3 pages, Department of Electrical & Computer Engineering, University of California, Davis.

Micro Chem, Nano SU-8, Negative tone Photoresist Formulations 50-100, 4 pages, Feb. 2002, <http://www.microchem.com/products/pdf/SU8_50-100.pdf>.

Optomec, Inc., M3D™ Technology, Maskless Mesoscale Materials Deposition (M3D), 1 page, <http://www.optomec.com/html/m3d.htm>, retrieved from the Internet on Aug. 15, 2003.

Optomec, Inc., M3D™, Maskless Mesoscale™ Materials Deposition, 2 pages, <http://www.optomec.com/downloads/M3DSheet.pdf>, retrieved from the Internet on Jun. 17, 2005.

Photo Vision systems, Inc., "Advances in Digital Image Sensors," 22 pages, First Annual New York State Conference on Microelectronic Design, Jan. 12, 2002.

Shen, X.-J. et al., "Microplastic embossing process: experimental and theoretical characterizations," Sensors and Actuators, A 97-98 (2002) pp. 428-433, Elsevier Science B.V.

Tapes II International Tape and Fabrication Company, Electronics and Electrical Tapes, 2 pages, 2003, <http://www.tapes2.com/electronics.htm>.

TransChip, 1 page, retrieved from the Internet on Aug. 26, 2003, <http://www.missionventures.com/portfolio/companies/transchip.html>.

TransChip, Inc., CMOS vs CCD, 3 pages, retrieved from the Internet on Dec. 14, 2005, <http://www.transchip.com/content.aspx?id=127>.

TransChip, Inc., Technology, 3 pages, retrieved from the Internet on Dec. 14, 2005, <http://www.transchip.com/content.aspx?id=10>.

UCI Integrated Nanosystems Research Facility, "Cleaning procedures for glass substrates," 3 pages, Fall 1999.

UCI Integrated Nanosystems Research Facility, "Glass Etch Wet Process," 3 pages. Summer 2000.

Walker, M.J., "Comparison of Bosch and cryogenic processes for patterning high aspect ratio features in silicon." 11 pages, Proc. SPIE vol. 4407, p. 89-99, MEMS Design, Fabrication, Characterization, and Packaging, Uwe F. Behringer; Deepak G. Uttamchandani; Eds., Apr. 2001.

Xsil, Via Applications, 1 page, <http://www.xsil.com/viaapplications/index.htm>, retrieved from the Internet on Jul. 22, 2003.

Xsil, Vias for 3D Packaging, 1 page, <http://www.xsil.com/viaapplications/3dpackaging/index.htm>, retrieved from the Internet on Jul. 22, 2003.

Ye, X.R. et al., "Immersion Deposition of Metal Films on Silion and Germanium Substrates in Supercritical Carbon Dioxide," Chem. Mater. 2003, 15, 83-91.

Yoshida, J. "TransChip rolls out a single-chip CMOS imager," 3 pages, EE Times, Jul. 18, 2003.

* cited by examiner

THROUGH-WAFER INTERCONNECTS FOR PHOTOIMAGER AND MEMORY WAFERS

FIELD OF THE INVENTION

The present invention relates generally to imager and memory wafers, and more particularly to through-wafer interconnects and blind vias for imager and memory devices.

BACKGROUND OF THE INVENTION

Figure 1:
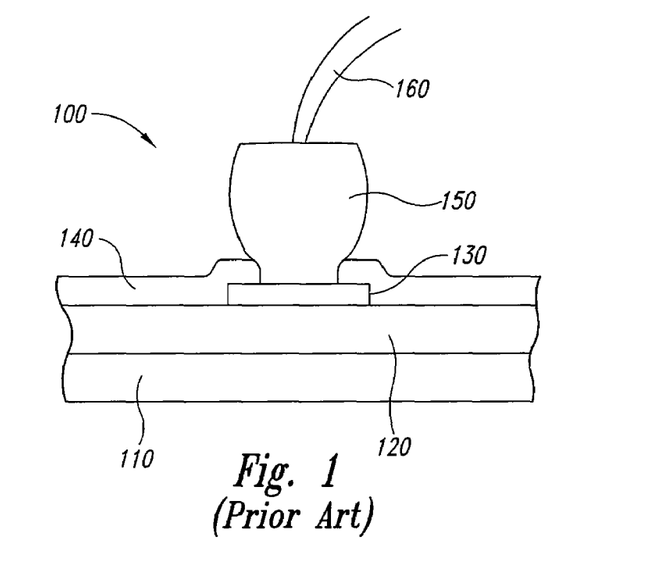
FIG. 1 depicts a conventional bond pad structure.

As depicted in FIG. 1, a conventional bond pad structure 100 is built on a silicon substrate 110 covered by an oxide layer 120. The bond pad 130 is embedded within a passivation layer 140. A conductive gold wire (160) ball (150) bond is formed and attached on a central upper surface of the bond pad 130.

A disadvantage of direct bond pad connection on the top side of the die, as depicted in FIG. 1, includes the fact that they sometimes require a wire bond 160 to be electrically connected to a lead frame or other structure for final die packaging. Another method that involves flip chip packaging at the wafer level involves a re-distribution layer (RDL) that allows the bond pad pitch to be routed to a more useable pitch in order to attach a solder ball directly on the top side of the die. Both of these packaging approaches involve contacting the bond pads on the top side of the die. As a result, this limits the ability to stack memory and imager devices. Furthermore, the ability to attach the cover glass on imager wafers at the wafer level is limited due to the requirement to make contact to the bond pad on the top side of the wafer. Accordingly, it is desirable to develop a through-wafer interconnect to eliminate the need for wire bonding, to increase the volumetric circuit device density, to minimize the size of the die's packaging, to make memory devices stackable and to enable wafer level packaging (WLP) methods for imager wafers.

BRIEF SUMMARY OF THE INVENTION

The present invention addresses the shortcomings described above and provides in disclosed exemplary embodiments a through-wafer interconnect for imager, memory and other integrated circuit applications, thereby eliminating the need for wire bonding, making devices incorporating such interconnects stackable to allow increased volumetric density and device functionality and enabling WLP for imager devices. Further, a smaller and more reliable die package is achieved and circuit parasitics (e.g., L and R) are reduced due to the reduced signal path lengths.

BRIEF DESCRIPTION OF THE DRAWINGS

The above and other features and advantages of the invention will be more readily understood from the following detailed description of the invention which is provided in connection with the accompanying drawings, in which.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those of ordinary skill in the art to make and use the invention, and it is to be understood that structural, logical or procedural changes may be made to the specific embodiments disclosed without departing from the spirit and scope of the present invention.

Figure 2:
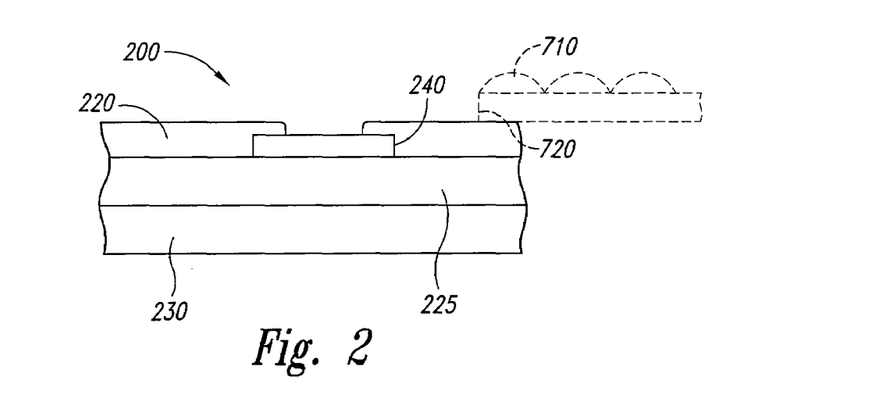
FIG. 2 depicts an initial portion of a process for manufacturing a through-wafer interconnect, in accordance with an exemplary embodiment of the invention.

FIG. 2 depicts a portion of a semiconductor wafer 200 at a stage of a process for manufacturing a through-wafer interconnect for an integrated circuit device. A bond pad 240 is depicted as being formed over a silicon (Si) substrate 230 and within a passivation layer 220 or layers. Beneath the passivation layer 220 is a borophosphosilicate glass (BPSG) layer 225. The bond pad 240 is depicted as being a monolithic structure, however, the bond pad 240 may take other forms including a multiple tiered structure. When the wafer 200 is an imager wafer, this portion of the process may be performed either prior to or after a color filter array (CFA) 720 and microlenses 710 (depicted in dotted lines) have been formed on the top surface of the wafer 200. One advantage to forming the interconnect prior to forming the CFA 720 and lenses 710 is that the CFA and lenses may be somewhat delicate and sensitive to heat; thus, forming the interconnect prior to their formation may result in less risk to damaging the array.

Figure 3:
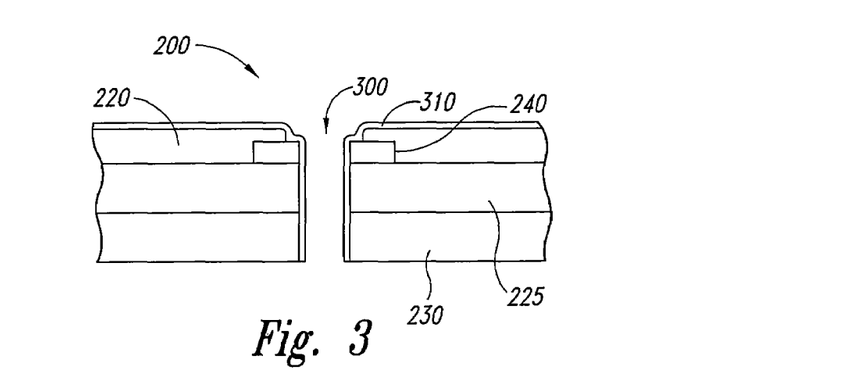
FIG. 3 depicts a further portion of a process for manufacturing a through-wafer interconnect, in accordance with an exemplary embodiment of the invention.

FIG. 3 depicts a hole, or via, 300 formed in a center of the bond pad 240 from the passivation layer 220 down through the substrate 230. The initial opening to create the hole 300 is formed by sequences of patterning and etching (either wet or dry) through the dielectric and metal layers. For instance, a dry etch may be performed to remove the top portion of passivation layer 220. A dry etch may be performed through the metal 240. A dry etch may be performed through the BPSG layer 225. A wet etch may be performed to form the initial hole 300 in the bulk silicon and to form an initial dimple in the Si 230. A laser drill process or deep silicon, dry etch process may then be conducted on the Si substrate 230, followed by a wet clean process. Also depicted is the application of a dielectric 310 to line the walls of the hole 300 and to electrically insulate the subsequent conductive materials in the via from shorting to the bulk silicon substrate. The dielectric also covers the top of the bond pad 240 and the upper passivation layer 220. The dielectric 310 may be low silane oxide (LSO) or any known method to deposit dielectric films using ALD, CVD, PECVD or other means commonly used in the art.

Figure 4:
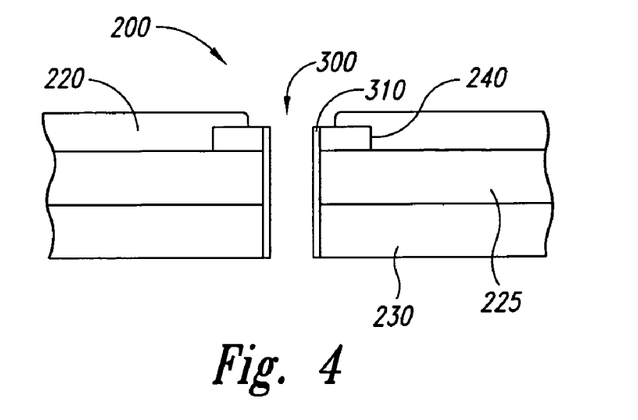
FIG. 4 depicts a further portion of a process for manufacturing a through-wafer interconnect, in accordance with an exemplary embodiment of the invention.

FIG. 4 depicts the interconnect structure with the dielectric 310 removed from the passivation layer 220 and the bond pad 240 by a spacer etch process (e.g., chemical mechanical polishing (CMP) or a dry vertical oxide etch). The dielectric 310 remains as a liner of the walls of the hole 300.

Figure 5:
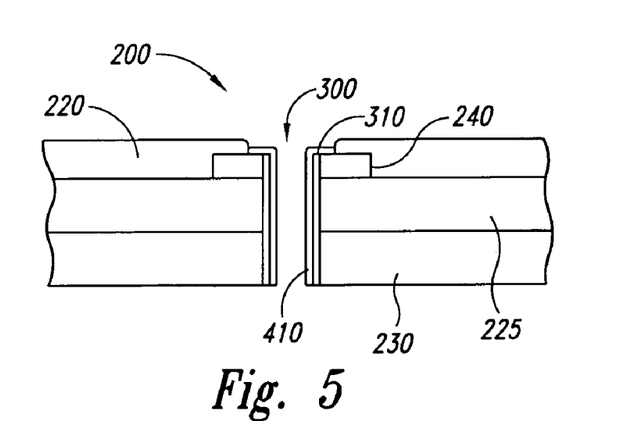
FIG. 5 depicts a further portion of a process for manufacturing a through-wafer interconnect, in accordance with an exemplary embodiment of the invention.

FIG. 5 depicts a plating layer 410 of nickel on a seed material such as titanium nitride (TiN) or tungsten (W), or copper (Cu) on tantalum (Ta), or copper (Cu) on tungsten (W), or other conductive materials and other combinations of these materials, deposited on top of the dielectric 310 on the sidewalls of the via 300 and on top of a portion of the bond pad 240. The seed material or materials are removed from the top passivation surface by CMP or photo/etch processing. This removal process does not remove the material in the via or on the bond pad.

Figure 6:
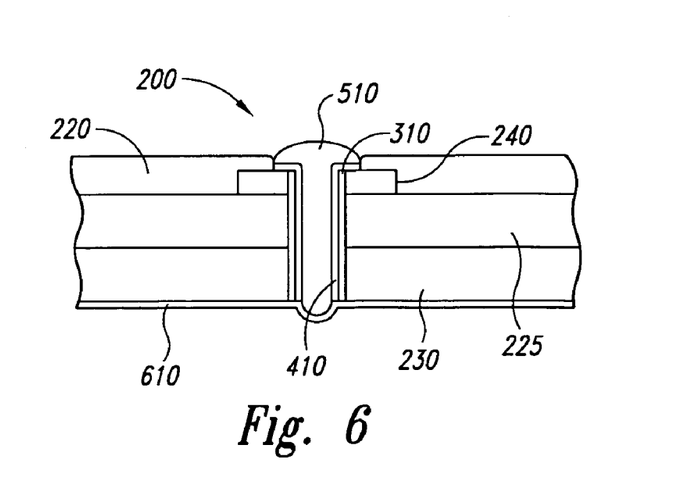
FIG. 6 depicts a further portion of a process for manufacturing a through-wafer interconnect, in accordance with an exemplary embodiment of the invention.

FIG. 6 depicts the hole 300 as being filled with solder 510 utilizing plating or molten solder. It should be noted that other conductive materials (e.g., copper, nickel, conductive polymers, etc.) may be used to fill the hole 300 and/or conductive materials may also be plated to fill the hole. (e.g., nickel, copper, etc.). A dielectric layer 610 is then applied to the lower surface of the wafer 200.

Figure 7:
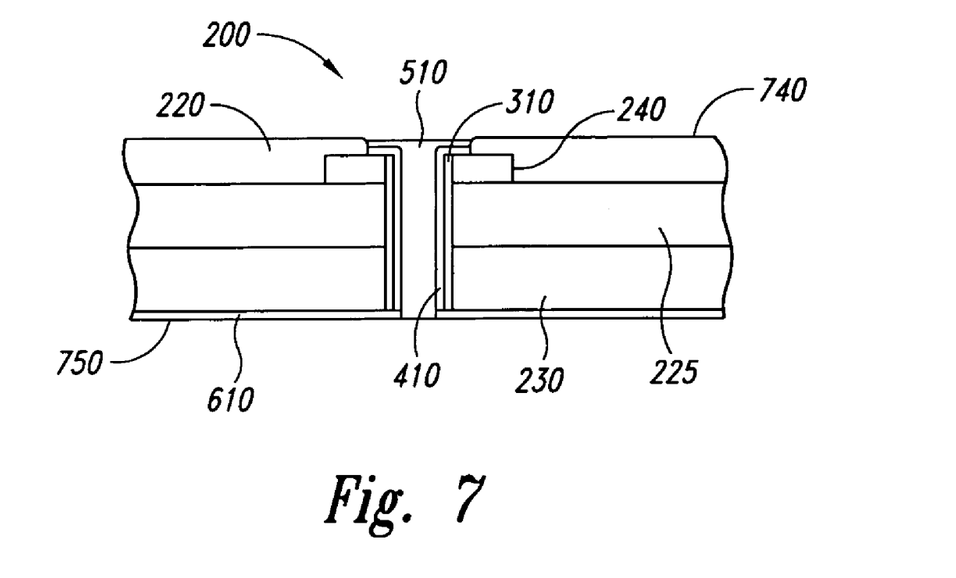
FIG. 7 depicts a further portion of a process for manufacturing a through-wafer interconnect, in accordance with an exemplary embodiment of the invention.
Figure 8:
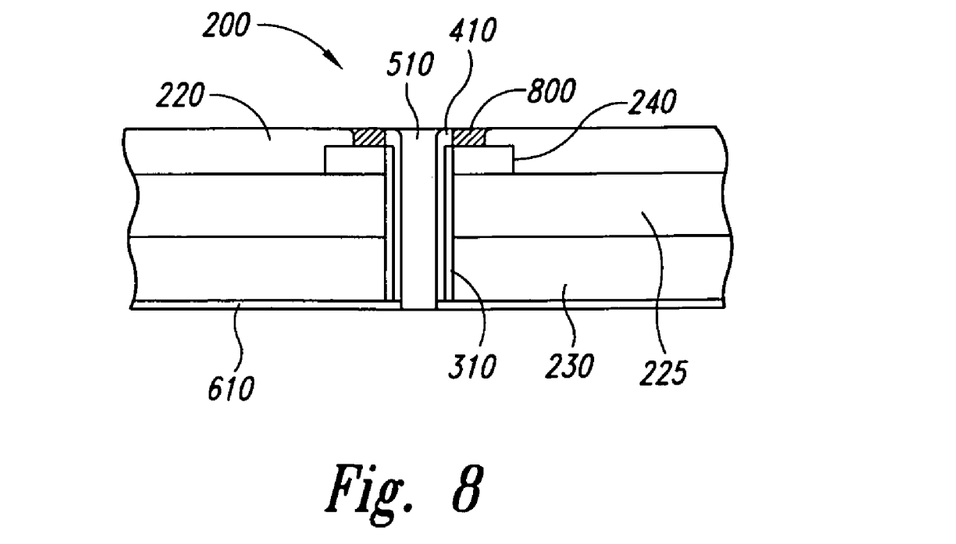
FIG. 8 depicts a further portion of a process for manufacturing a through-wafer interconnect, in accordance with an exemplary embodiment of the invention.

As depicted in FIG. 7, a CMP process may then be performed on the top surface 740 and the bottom surface 750. Another variation of the process is to use a wet etch rather then CMP to etch away the protruding solder 510 or nickel plating 800 (FIG. 8). It should be noted that the CMP process may not be necessary for memory device applications as the final surface topography may not be critical. For an imager wafer, the CFA 720 and lenses 710 are then formed on top of the upper flat surface 740. Performing a planarization process after the solder 510 fill operation helps to provide a smooth surface in which to apply the CFA and microlens material. The smooth wafer surface prevents streaking and other imperfections which can affect the optical performance of the CFA and microlens structures.

In accordance with an exemplary embodiment of the invention, the via 510 electrically connects bond pad 240 with the top surface 740 of the wafer and the bottom surface 750 of the wafer resulting in a much more efficient package that is stackable for memory devices and that lends itself to wafer level packaging for imager devices.

FIG. 8 depicts another exemplary embodiment in which the nickel plating 800 is flush with the passivation layer 220. In this embodiment, the top metal layer of the bond pad 240 is plated with nickel. In this manner, when the solder 510 filling the hole 300 is planarized by CMP, the nickel remains at the top-most portion of the through-wafer interconnect.

Figure 9:
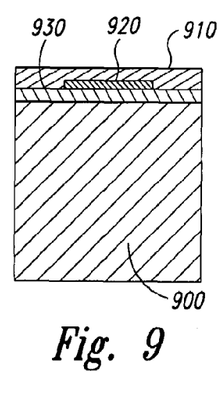
FIG. 9 depicts an initial portion of a process for manufacturing a blind via, in accordance with an exemplary embodiment of the invention.
Figure 10:
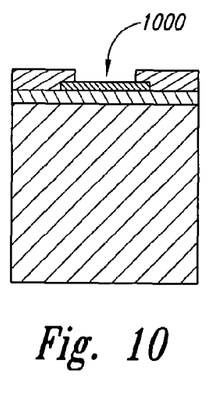
FIG. 10 depicts a further portion of a process for manufacturing a blind via, in accordance with an exemplary embodiment of the invention.

Turning to FIG. 9, an initial step in another exemplary process for forming a through-wafer interconnect with a blind via is depicted. An initial step in this exemplary process is to form a blind via that recesses only partially through a semiconductor substrate. A simplified illustration of a completed wafer is depicted as containing a silicon substrate 900 and a bond pad 920 provided near an upper surface which is surrounded by a passivation layer 910. The passivation layer 910 is located above an insulation layer, such as BPSG layer 930. As depicted in FIG. 10, the passivation layer is removed from an area over a portion of bond pad 920, by a dry etch process up to the bond pad 920 leaving an opening 1000 in the passivation layer.

Figure 11:
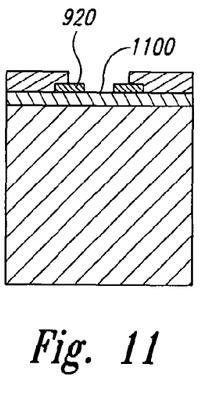
FIG. 11 depicts a further portion of a process for manufacturing a blind via, in accordance with an exemplary embodiment of the invention.
Figure 12:
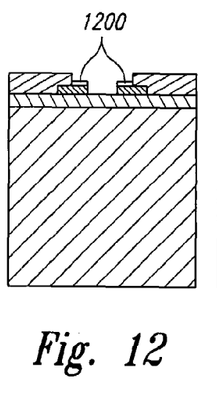
FIG. 12 depicts a further portion of a process for manufacturing a blind via, in accordance with an exemplary embodiment of the invention.
Figure 13:
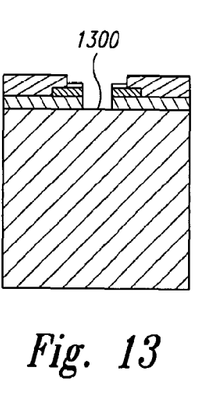
FIG. 13 depicts a further portion of a process for manufacturing a blind via, in accordance with an exemplary embodiment of the invention.
Figure 14:
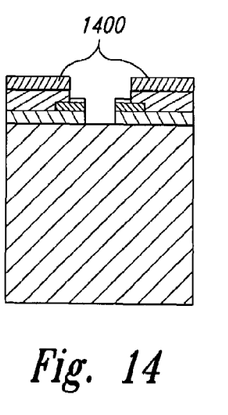
FIG. 14 depicts a further portion of a process for manufacturing a blind via, in accordance with an exemplary embodiment of the invention.

As depicted in FIG. 11, a wet or dry metal etch is performed through the bond pad 920 down to surface 1100 of the BPSG layer 930. FIG. 12 depicts a nickel plating 1200 formed on the bond pad 920. An oxide etch is performed on the lower passivation layer and down to the top layer 1300 of the silicon substrate 900, as depicted in FIG. 13. FIG. 14 depicts the optional application of a polyimide coat 1400 to planarize and protect the frontside of the wafer from residual metals on the vertical surfaces of the wafer topography. These residual metals are formed when material is not sufficiently removed in previous CMP or wet or dry etch processing.

Figure 15:
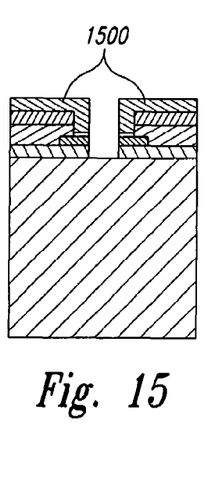
FIG. 15 depicts a further portion of a process for manufacturing a blind via, in accordance with an exemplary embodiment of the invention.
Figure 16:
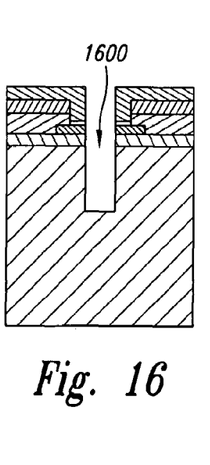
FIG. 16 depicts a further portion of a process for manufacturing a blind via, in accordance with an exemplary embodiment of the invention.
Figure 17:
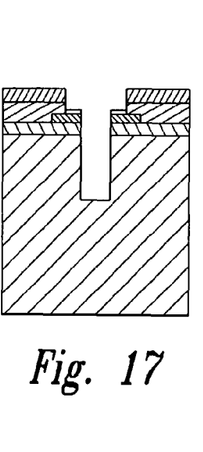
FIG. 17 depicts a further portion of a process for manufacturing a blind via, in accordance with an exemplary embodiment of the invention.
Figure 18:
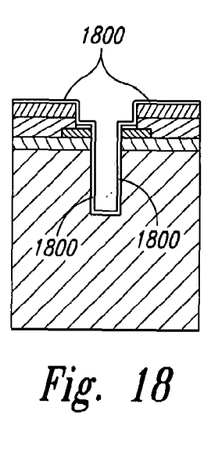
FIG. 18 depicts a further portion of a process for manufacturing a blind via, in accordance with an exemplary embodiment of the invention.
Figure 19:
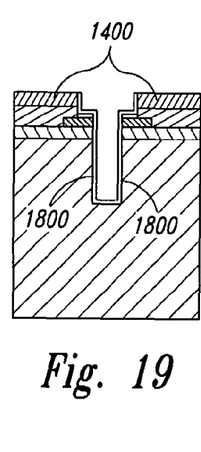
FIG. 19 depicts a further portion of a process for manufacturing a blind via, in accordance with an exemplary embodiment of the invention.

As depicted in FIG. 15, a resist coat 1500 is applied for performing a deep silicon etch. The results of the etch are depicted in FIG. 16 in which a via 1600 approximately 150-300 micrometers deep has been etched. The deep silicon etch resist coat 1500 is then stripped, as depicted in FIG. 17. FIG. 18 depicts the deposition of a dielectric material 1800 on the via 1600 sidewalls and other surfaces. The dielectric 1800 serves as an electrical insulation layer for the sidewalls. In FIG. 19, results of a spacer dry etch are depicted as having removed the dielectric from the surface 1400, but maintaining the dielectric 1800 on the via sidewalls.

Figure 20:
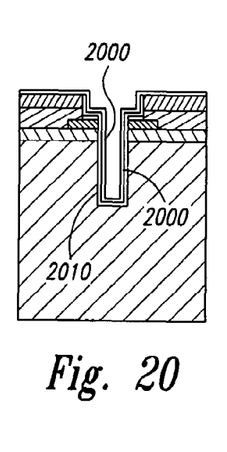
FIG. 20 depicts a further portion of a process for manufacturing a blind via, in accordance with an exemplary embodiment of the invention.
Figure 21:
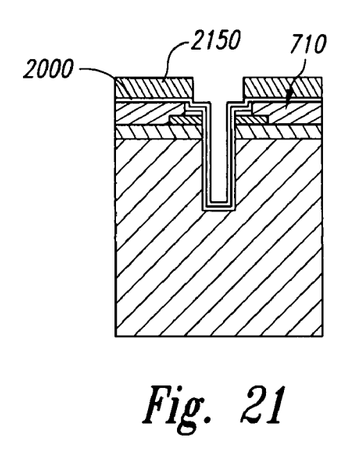
FIG. 21 depicts a further portion of a process for manufacturing a blind via, in accordance with an exemplary embodiment of the invention.
Figure 22:
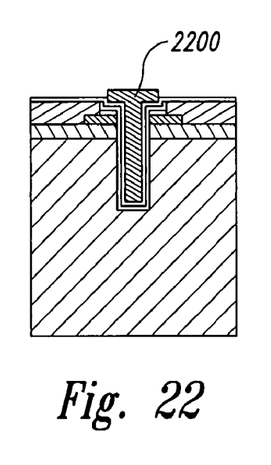
FIG. 22 depicts a further portion of a process for manufacturing a blind via, in accordance with an exemplary embodiment of the invention.
Figure 23:
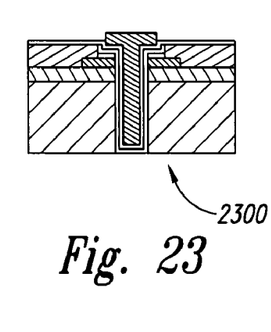
FIG. 23 depicts a further portion of a process for manufacturing a blind via, in accordance with an exemplary embodiment of the invention.

Turning to FIG. 20, a seed layer of conductive material is formed on the dielectric and on the metal bond pads through processes known in the art such as e.g., CVD, PECVD, PVD. In FIG. 21, the seed layer is covered with photoresist 2150 to protect the surface from subsequent plating steps. Electroless or electrolytic nickel plating 2000 is depicted on the sidewalls 2010 of the via 1600 and also on the top portion of the bond pad 920. In the optional flow of using polyimide 1400, the polyimide 1400 may be stripped from the surface of the passivation layer 910 (FIG. 21). The via 1600 is filled with conductive material such as solder 2200 utilizing plating or molten solder as depicted in FIG. 22. FIG. 23 depicts a thinned wafer 2300 having been processed by backgrind, CMP, wet etch, dry etch, or any other thinning method known in the art.

Figure 24:
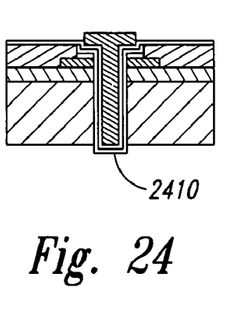
FIG. 24 depicts a further portion of a process for manufacturing a blind via, in accordance with an exemplary embodiment of the invention.
Figure 25:
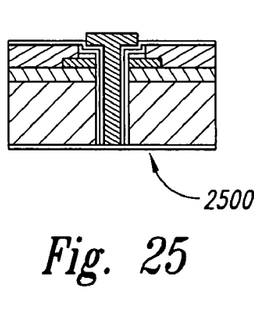
FIG. 25 depicts a further portion of a process for manufacturing a blind via, in accordance with an exemplary embodiment of the invention.

FIG. 24 depicts an optional tetramethylammonium hydroxide (TMAH) silicon etch that exposed the dielectric 2410 on the bottom side of the via and causes the via insulation and via fill material to slightly protrude out from the backside surface. Regardless of whether the TMAH etch is performed, a dielectric deposition is applied to passivate the backside 2500 of the wafer, as illustrated in FIG. 25. With the via protruding in the manner described, CMP or a wet etch may be performed across the entire backside of the wafer in order to remove the insulating material covering the solder while maintaining a passivation layer over bulk silicon regions of the backside of the wafer.

Figure 26:
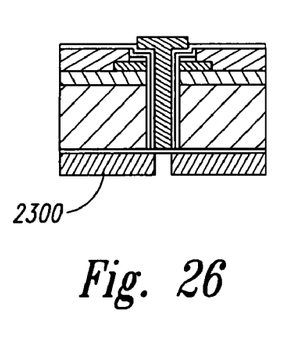
FIG. 26 depicts a further portion of a process for manufacturing a blind via, in accordance with an exemplary embodiment of the invention.
Figure 27:
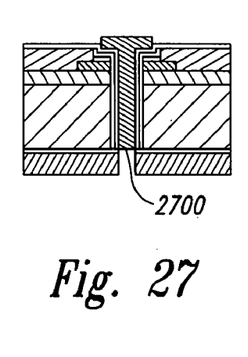
FIG. 27 depicts a further portion of a process for manufacturing a blind via, in accordance with an exemplary embodiment of the invention.
Figure 28:
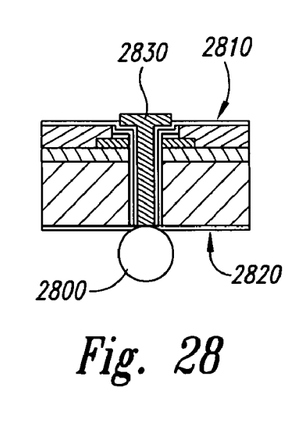
FIG. 28 depicts a further portion of a process for manufacturing a blind via, in accordance with an exemplary embodiment of the invention.

As an alternate embodiment to CMP exposure of the solder on the backside of the wafer, turning to FIG. 26, a resist 2600 is applied to the backside of the wafer and in FIG. 27, the lower level of passivation is removed by applying a photo pattern and performing a wet oxide etch or dry spacer etch to expose the lower layer of solder 2700. The resist is stripped and a solder ball 2800 may be attached to the bottom of the via 1600, as depicted in FIG. 28. Alternatively, a solder ball 2800 could be attached to the top of the via 1600, or a solder ball 2800 could be attached to both the top and the bottom, or not attached at all.

As depicted in FIG. 28, a through-wafer interconnect 2830 is formed in which the interconnect 2830 extends from a topside surface 2810 of the wafer where it is electrically connected to a bond pad 920, to a bottomside surface 2820 of the wafer and in which a solder ball 2800 is attached and electrically connected to the bottomside surface of the interconnect 2830. As a result, the interconnect 2830 is actually part of the structure of the device or circuit included within the wafer and is more reliable, due to shorter connections and fewer parts, enabling a subsequent packaging size of the die to be greatly reduced and allowing die to be stacked with no wire bonding.

Turning to FIGS. 29-35, a second exemplary process for forming a blind via is depicted. The beginning of the second exemplary process is identical to the portions of the first exemplary process depicted above in connection with FIGS. 9-22 The process continues at FIG. 29, as described below.

Figure 29:
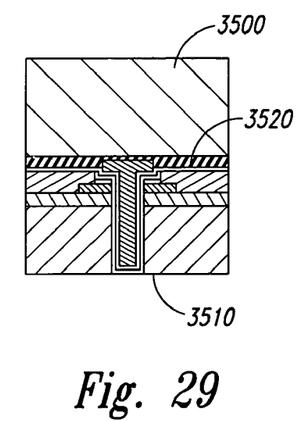
FIG. 29 depicts a further portion of a process for manufacturing a blind via, in accordance with another exemplary embodiment of the invention.
Figure 30:
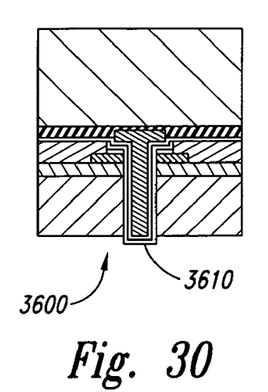
FIG. 30 depicts a further portion of a process for manufacturing a blind via, in accordance with another exemplary embodiment of the invention.

FIG. 29 depicts a carrier 3500 bonded to the upper layer of the wafer with a carrier bonding adhesive 3520 and the wafer is thinned to surface 3510 though any thinning process known in the art. The carrier material could be a substrate such as silicon, glass, silicon nitride, aluminum nitride, or any other material suitable for use as a carrier substrate. The adhesive can be photoresist, photo-definable epoxy, an adhesive tape medium, UV releasable tape, etc. A TMAH silicon etch may be optionally performed to expose the via 3610 at the bottom of the via and cause it to slightly protrude from the surface, as depicted in FIG. 30.

Figure 31:
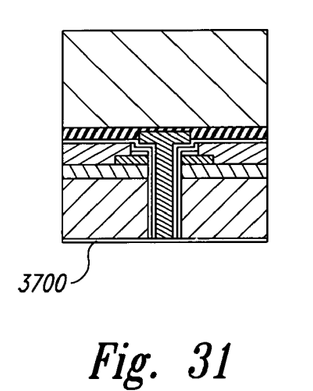
FIG. 31 depicts a further portion of a process for manufacturing a blind via, in accordance with another exemplary embodiment of the invention.
Figure 32:
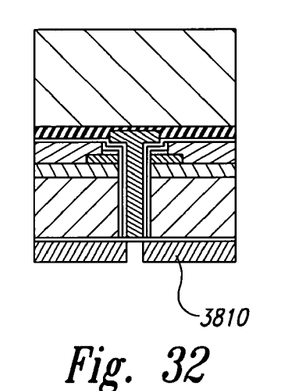
FIG. 32 depicts a further portion of a process for manufacturing a blind via, in accordance with another exemplary embodiment of the invention.
Figure 33:
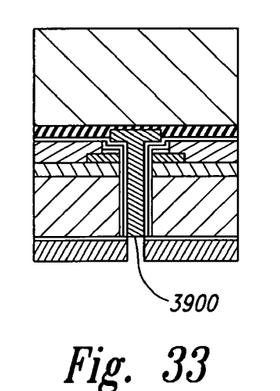
FIG. 33 depicts a further portion of a process for manufacturing a blind via, in accordance with another exemplary embodiment of the invention.
Figure 34:
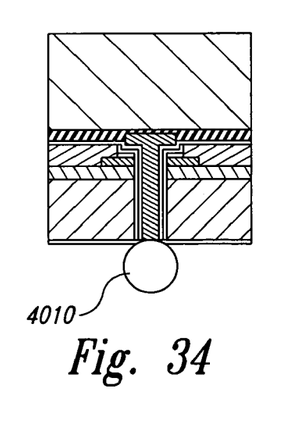
FIG. 34 depicts a further portion of a process for manufacturing a blind via, in accordance with another exemplary embodiment of the invention.
Figure 35:
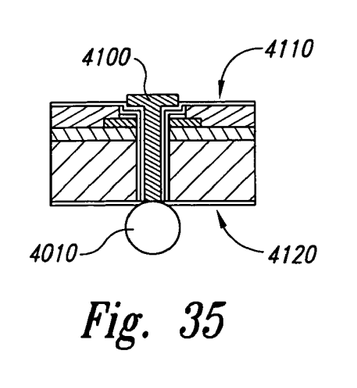
FIG. 35 depicts a further portion of a process for manufacturing a blind via, in accordance with another exemplary embodiment of the invention.

FIG. 31 depicts a dielectric deposition 3700 to passivate the backside of the wafer and FIG. 32 depicts a resist and pattern 3810 applied to the backside of the wafer to prepare for an etch process on the backside. A wet passivation etch or dry spacer etch is performed to remove the backside passivation 3700 from the solder via 3900, as depicted at FIG. 33. This may also be accomplished with a light CMP or grind operation which leaves passivation material over the bulk silicon while allowing the solder to be exposed on the backside of the filled via. FIG. 34 depicts the removal of the resist 3810 and the application of solder ball 4010. FIG. 35 depicts removal of the carrier 3500.

Here again, a through-wafer interconnect 4100 is formed in which the interconnect 4100 extends from a topside surface 4110 of the wafer, where it is electrically connected to a bond pad 920, to a bottomside surface 4120 of the wafer and in which a solder ball 4010 is attached and electrically connected to the interconnect 4100. The interconnect is part of the structure of the device or circuit included within a die and is more reliable, due to fewer connections and external parts, enabling a subsequent packaging size of a die to be greatly reduced.

In accordance with exemplary embodiments of the invention, packaging solutions are described which eliminate wire bonding to bond pads. As a result, die performance and reliability are enhanced. Furthermore, these processes result in much smaller die packages which may be stacked and which lend themselves to WLP. Packaging costs are also significantly reduced as a result.

While the invention has been described in detail in connection with preferred embodiments known at the time, it should be readily understood that the invention is not limited to the disclosed embodiments. Rather, the invention can be modified to incorporate any number of variations, alterations, substitutions or equivalent arrangements not heretofore described, but which are commensurate with the spirit and scope of the invention. For example, although the processes are described in a specific order, some of the process steps may be performed in an order different than that described above. Further, while the processes are described in connection with imager and memory wafers, the invention is not limited to such applications. The invention may be practiced with other types of wafers as well as any device that would benefit from such a through-wafer interconnect. Accordingly, the invention is not limited by the foregoing description or drawings, but is only limited by the scope of the appended claims.

The invention claimed is:

1. A method for forming an interconnect, comprising forming an electrically conductive interconnect through a wafer, wherein the interconnect extends from a frontside surface of the wafer to a backside surface of the wafer, and wherein forming the electrically conductive interconnect further comprises:
    forming a hole through a bond pad in the wafer, the hole extending from the frontside surface of the wafer to the backside surface of the wafer;
    coating sidewalls of the hole with a dielectric;
    applying a first conductive material to the dielectric;
    filling the hole with a second conductive material, the second conductive material extending from the frontside surface to the backside surface and being electrically coupled to the bond pad, wherein the second conductive material is co-planar and/or recessed with respect to the frontside surface and surrounded by a dielectric passivation material at the frontside surface; and
    performing a chemical mechanical polish on the passivation material after filling the hole with the second conductive material.

2. The method of claim 1 further comprising:
    creating a substantially flat surface on the frontside surface and the backside surface of the wafer after filling the hole with the second conductive material.

3. The method of claim 2, wherein the act of creating comprises performing a wet etch on at least the backside surface of the wafer.

4. The method of claim 1, wherein the act of forming the hole comprises:
    performing an etch to expose an upper portion of the bond pad and to create the hole through the wafer.

5. The method of claim 1, wherein the act of coating comprises coating the sidewalls with a low silane oxide.

6. The method of claim 1, wherein the act of coating comprises depositing the dielectric layer by chemical vapor deposition.

7. The method of claim 1, wherein the act of applying comprises:
    applying a layer of nickel on one of titanium nitride and tungsten.

8. The method of claim 1, wherein the act of applying comprises:
    applying a layer of copper on tantalum.

9. The method of claim 1, wherein the act of applying comprises:
    applying a layer of copper on tungsten.

10. The method of claim 1, wherein the act of filling comprises filling the hole with solder.

11. The method of claim 1, wherein the act of filling comprises filling the hole by plating the sidewalls with a conductive material.

12. The method of claim 1, further comprising forming a plated layer of a conductive material on top of the bond pad and along an outer edge of the hole, the plated layer of the conductive material extending from the frontside surface of the wafer to a top surface of the bond pad.

13. The method of claim 1 further comprising:
    forming at least one of a color filter array and a microlens on the wafer.

14. A method for forming an interconnect, comprising forming an electrically conductive interconnect through a wafer, wherein the interconnect extends from a frontside surface of the wafer to a backside surface of the wafer, and wherein forming the electrically conductive interconnect further comprises:
    forming a hole through a bond pad in the wafer, the hole extending from the frontside surface of the wafer to the backside surface of the wafer;
    coating sidewalls of the hole with a dielectric;
    applying a first conductive material to the dielectric;
    filling the hole with a second conductive material, the second conductive material extending from the frontside surface to the backside surface and being electrically coupled to the bond pad; and
    creating a flat surface on the frontside surface and the backside surface of the wafer, wherein the act of creating comprises performing a chemical mechanical polish on at least the frontside surface of the wafer after filling the hole with the second conductive material.

15. A method for forming an interconnect through a wafer, the method comprising:
    forming a blind hole though a bond pad in the wafer, the hole extending only partially through the wafer from a frontside surface of the wafer to a portion of the wafer below a lower surface of the bond pad; and
    filling the hole with an electrically conductive material, the electrically conductive material extending from the frontside surface to an opposite end of the hole;
    thinning the wafer from a backside surface of the wafer after filling the hole with the electrically conductive material, wherein the wafer is thinned from the backside surface until the hole is in contact with the backside surface; and
    insulating the backside surface of the wafer.

16. The method of claim 15 further comprising:
    performing a tetramethylammonium hydroxide (TMAH) silicon etch to cause the electrically conductive material in the hole to slightly protrude out from the backside surface of the wafer.

17. The method of claim 15 further comprising attaching a solder ball to the electrically conductive material within the hole at the backside surface of the wafer.

18. The method of claim 15, wherein the act of forming the hole comprises performing an etch through the bond pad to a portion of the wafer below the bond pad.

19. The method of claim 18, wherein the act of forming the hole comprises forming the hole approximately 150-300 micrometers deep.

20. The method of claim 15, wherein the act of filling comprises filling the hole with solder.

21. The method of claim 15, wherein the act of thinning comprises backgrinding the backside surface of the wafer.

22. The method of claim 15 further comprising the act of attaching a carrier to the frontside of the wafer in order to perform the act of thinning.

23. The method of claim 22 further comprising detaching the carrier after performing the act of thinning.

24. The method of claim 15, wherein the act of thinning comprises performing a chemical mechanical polish on the backside surface of the wafer.

25. A method of forming an interconnect through a wafer, the method comprising:

forming a blind hole through a bond pad in the wafer, the hole extending only partially through the wafer from a frontside surface of the wafer to a portion of the wafer below a lower surface of the bond pad;

filling the hole with an electrically conductive material, the electrically conductive material being in electrical contact with the bond pad and extending from the frontside surface to an opposite end of the hole;

thinning a backside surface of the wafer up to a lower portion of the hole, wherein the backside surface is thinned after filling the hole with the electrically conductive material;

insulating the backside surface of the wafer; and attaching an electrically conductive ball to the electrically conductive material within the hole and on the backside surface of the wafer, such that the electrically conductive ball is in electrical contact with the bond pad.

26. A method for forming an interconnect through a wafer, the method comprising:

forming a hole through a bond pad in the wafer, the hole extending from a frontside surface of the wafer to a backside surface of the wafer;

coating sidewalls of the hole with a dielectric;

filling the hole with an electrically conductive material, the electrically conductive material being electrically coupled to the bond pad and extending from the frontside surface to the backside surface, wherein the electrically conductive material is co-planar and/or recessed with respect to the frontside surface and surrounded by a dielectric passivation material at the frontside surface; and performing a chemical mechanical polish on the passivation material after filling the hole with the second conductive material.

27. The method of claim 26 further comprising performing a wet etch on at least the frontside of the wafer.

28. A method of forming a through-wafer interconnect, the method comprising the acts of:

forming a blind hole through a bond pad in the wafer, the hole extending only partially through the wafer from a frontside surface of the wafer to a portion of the wafer below a lower surface of the bond pad;

filling the hole with an electrically conductive material, the electrically conductive material being electrically coupled to the bond pad and extending from the frontside surface to an opposite end of the hole;

thinning the wafer from a backside surface of the wafer until the hole is in contact with the backside surface of the wafer, wherein the backside surface is thinned after filling the hole with an electrically conductive material; and passivating the backside surface of the wafer.

29. The method of claim 28 further comprising attaching a solder ball to the electrically conductive material within the hole at the backside surface of the wafer, the ball being electrically coupled to the bond pad.

30. A method for forming an interconnect, the method comprising the acts of:

forming an electrically conductive interconnect through a wafer, including:

forming a hole completely through the wafer;

coating sidewalls of the hole with a dielectric; and filling the hole with a conductive material, wherein the interconnect extends from a frontside surface of the wafer to a backside surface of the wafer and is at least substantially co-planar with the frontside surface and surrounded by a dielectric passivation material at the frontside surface;

forming an electrically conductive bond between the interconnect and a bond pad within the wafer; and performing a chemical mechanical polish on the passivation material after filling the hole with the conductive material.

31. The method of claim 30 further comprising:

forming an electrically conductive bond between an electrically conductive ball and the electrically conductive interconnect on at least one of the frontside surface and the backside surface.

32. The method of claim 30 further comprising performing a wet etch on at least the frontside of the wafer.

* * * * *

UNITED STATES PATENT AND TRADEMARK OFFICE
CERTIFICATE OF CORRECTION

PATENT NO. : 7,300,857 B2
APPLICATION NO. : 10/932296
DATED : November 27, 2007
INVENTOR(S) : Akram et al.

It is certified that error appears in the above-identified patent and that said Letters Patent is hereby corrected as shown below:

In column 8, line 32, in Claim 15, delete "though" and insert -- through --, therefor.

Signed and Sealed this

Eighth Day of April, 2008

JON W. DUDAS
*Director of the United States Patent and Trademark Office*